(12) United States Patent
Matsuoka (10) Patent No.: US 7,622,964 B2
(45) Date of Patent: *Nov. 24, 2009

(54) ANALOG BUFFER CIRCUIT

(75) Inventor: Yoshitaka Matsuoka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/387,655

(22) Filed: Mar. 23, 2006

(65) Prior Publication Data

US 2006/0214703 A1    Sep. 28, 2006

(30) Foreign Application Priority Data

Mar. 25, 2005    (JP)    ............... 2005-088875

(51) Int. Cl.
*H03B 1/00*    (2006.01)
*H03K 3/00*    (2006.01)

(52) U.S. Cl. .................. 327/108; 327/379; 327/389; 326/82

(58) Field of Classification Search .......... 327/108, 327/112, 379, 389, 391; 330/262; 326/82
See application file for complete search history.

(56) References Cited

U.S. PATENT DOCUMENTS

| | | | | |
|---|---|---|---|---|
| 6,198,334 | B1 * | 3/2001 | Tomobe et al. ............. | 327/391 |
| 6,437,611 | B1 * | 8/2002 | Hsiao et al. ................ | 327/108 |
| 6,850,089 | B2 * | 2/2005 | Huang et al. ............... | 326/26 |
| 6,885,234 | B2 * | 4/2005 | Ando ........................ | 327/534 |
| 6,970,015 | B1 * | 11/2005 | Chan et al. ................. | 326/82 |
| 7,109,758 | B2 * | 9/2006 | Lin ............................ | 326/112 |
| 7,285,998 | B2 * | 10/2007 | Matsuoka .................. | 327/175 |
| 2005/0168250 | A1 * | 8/2005 | Lin ............................ | 327/112 |
| 2006/0214713 | A1 * | 9/2006 | Matsuoka .................. | 327/175 |

FOREIGN PATENT DOCUMENTS

JP    7-191303    7/1995

OTHER PUBLICATIONS

Rail-to-rail low-power high-slew-rate CMOS analogue buffer Carrillo, J.M.; Carvajal, R.G.; Torralba, A.; Duque-Carillo, J.F.; Electronic Letters, vol. 40, Issue 14, Jul. 8, 2004 pp. 843-844.*

* cited by examiner

*Primary Examiner*—Lincoln Donovan
*Assistant Examiner*—Patrick O'Neill
(74) *Attorney, Agent, or Firm*—Michael Best & Friedrich LLP (57) ABSTRACT

An analog buffer circuit (10) includes a first p channel field effect transistor (11), an n channel field effect transistor (12) and a second p channel field effect transistor (13). The transistors are connected to one another in serial between power supplying terminals (VDD and GND). The transistors have gates connected to an input terminal (IN) in common. An output terminal (OUT) is connected to a connecting point between the n channel transistor and the second p channel transistor. With this structure, output voltage which appears on the output terminal is approximately proportional to input voltage supplied to the input terminal.

7 Claims, 7 Drawing Sheets

ANALOG BUFFER CIRCUIT

This application claims priority to prior application JP 2005-88875, filed Mar. 25, 2005, the disclosure of which is incorporated herein by reference.

BACKGROUND OF THE INVENTION

This invention relates to an analog buffer circuit, in particular, to an analog buffer circuit having a linear input-output voltage characteristic and a high input impedance.

A conventional analog buffer circuit has a complicated circuitry to have a linear input-output voltage characteristic for a predetermined range of input voltage. A simpler analog buffer circuit is configured using a differential circuit and a mirror circuit. Such an analog buffer circuit is disclosed in Unexamined Japanese Patent Publication No. 7-191393.

Recently, there is a demand to miniaturize each circuit included in a large scale integrated circuit with increase of demand for higher degree of integration with regard to the large scale integrated circuit. However, it is difficult to meet the demand because of the complicated circuitry with regard to the analog buffer.

SUMMARY OF THE INVENTION

It is therefore, an object of this invention to provide an analog buffer circuit having a linear input-output voltage characteristic, high input impedance and a simple circuitry.

Other objects of this invention will become clear as the description proceeds.

According to an aspect of this invention, an analog buffer has an approximately linear input output voltage characteristic. The analog buffer comprises three field effect transistors which are disposed between an input terminal and an output terminal to accomplish the approximately linear input output voltage characteristic.

In the analog buffer circuit, the field effect transistors may be connected in serial between power supplying terminals. In this case, the field effect transistors have gates connected to the input terminal in common.

Furthermore, the field effect transistors may be two p channel field effect transistors and an n channel field effect transistor connected between the p channel field effect transistors. In this case, the output terminal is connected to a connecting point between the n channel field effect transistor and one of the p channel field effect transistors that located at lower potential side.

DESCRIPTION OF THE PREFERRED EMBODIMENT

Referring to FIGS. 1 to 7, a description will be made about a preferred embodiment of this invention.

Figure 1:
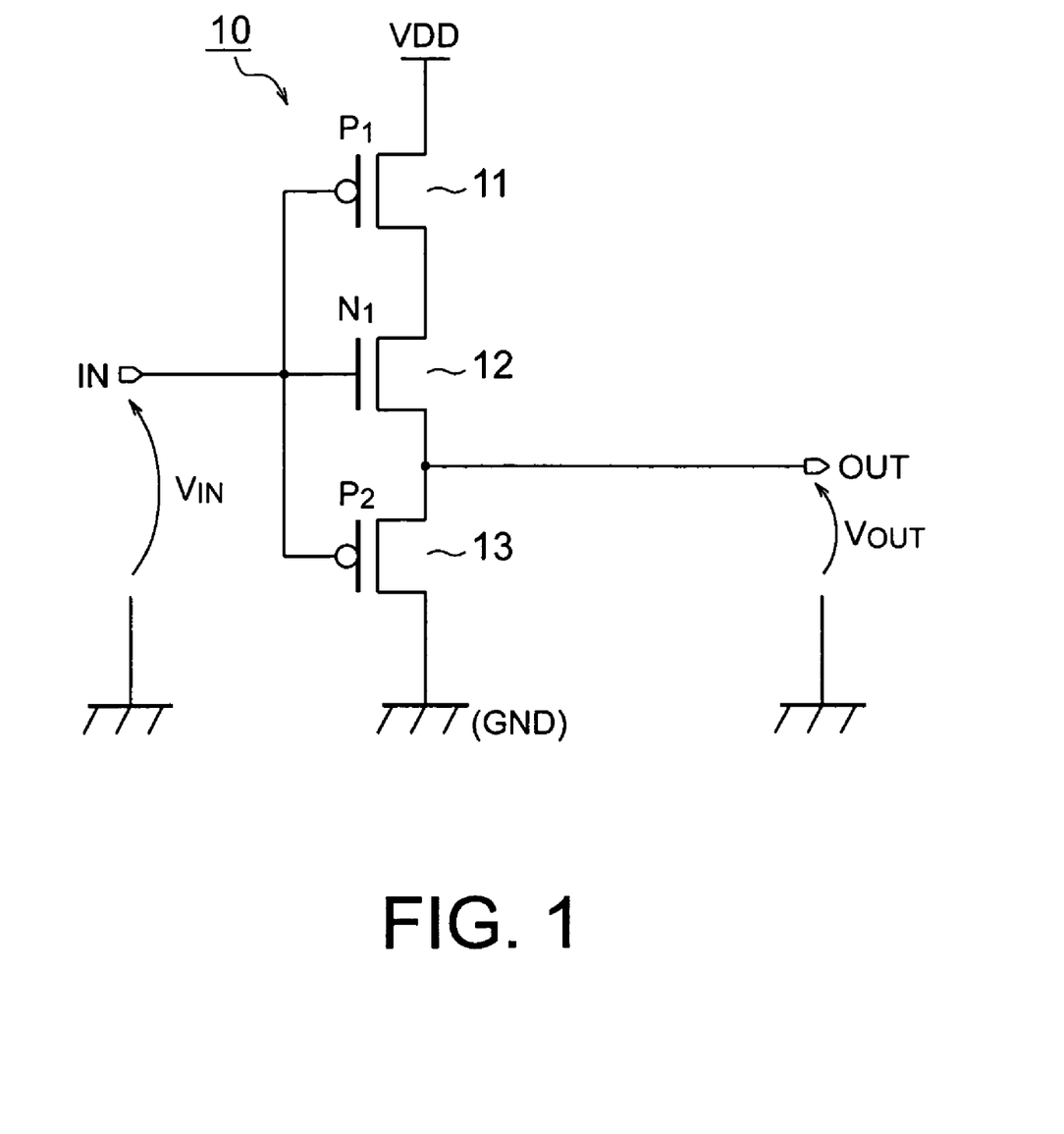
FIG. 1 is a circuit diagram of an analog buffer circuit according to a preferred embodiment of this invention.

FIG. 1 is shows an analog buffer circuit 10 according to the preferred embodiment. The analog buffer circuit 10 has three field effect transistors (FETs) connected in series between power supply terminals (i.e. between VDD and GND).

In particular, a first p channel MOSFET 11, an n channel MOSFET 12 and a second p channel MOSFET 13 are connected in this order between a high potential side voltage terminal and a low potential side voltage terminal. The high potential side voltage terminal receives high potential side source voltage VDD while the low potential side voltage terminal receives low potential side source voltage GND. The MOSFETs 11, 12 and 13 may be simply called first PMOS, NMOS and second PMOS, respectively.

The MOSFETs 11, 12 and 13 have gates commonly connected to an input terminal IN. An output terminal OUT is connected to a connecting point between the NMOS 12 and the second PMOS 13. With this structure, a current supplied to the input terminal IN does not flow to the output terminal OUT. Accordingly, the analog buffer circuit 10 has high input impedance.

The analog buffer circuit 10 operates as follows.

Supplying input voltage Vin to the input terminal IN, current flows from the high potential side voltage terminal to the low potential side voltage terminal through the MOSFETs 11, 12 and 13 in response to the input voltage Vin. As a result, an output voltage Vout appears on the output terminal OUT according to the input voltage Vin.

In particular, the first PMOS 11 has a source receives the high potential side source voltage VDD. Accordingly, the first PMOS 11 turns on when the input voltage Vin is smaller than a total of the source voltage VDD and a first threshold voltage Vthp1 for the first PMOS 11. The first PMOS 11 supplies electric potential of a range 0 to VDD [V] to a drain of the NMOS 12 when it turns on. Herein, it is assumed that the input voltage Vin is changed to turn on the first PMOS 11 always.

The NMOS 12 either turns on or off in response to a difference between the input voltage Vin and the output voltage Vout (i.e. a gate-source voltage). That is, if the input voltage Vin is equal to or larger than a total of the output voltage Vout and a threshold voltage Vthn for the NMOS 12, the NMOS 12 turns on. If not, the NMOS 12 turns off.

Similarly, the second PMOS 13 either turns on or off in response to the difference between the input voltage Vin and the output voltage Vout (i.e. a gate-source voltage). The second PMOS 13 turns on differently from the NMOS 12 when the input voltage Vin is smaller than a total of the output voltage Vout and a threshold voltage Vthp2 for the PMOS 13. Otherwise, the NMOS 12 turns off.

Here, it is assumed that the threshold voltages Vthp1, Vthp2 and Vthn are equal to 0 [V]. In this assumption, the first PMOS 11 turns on and supplies the electric potential between 0 and VDD [V] to the drain of the NMOS 12 when the input voltage Vin is smaller than the high source voltage VDD. The NMOS 12 turns on when the input Vin is equal to or lager than the output voltage Vout. The NMOS 12 turns off when the input Vin is smaller than the output voltage Vout. The second PMOS 13 turns off when the input Vin is equal to or smaller than the output voltage Vout. The second PMOS 13 turns on when the input Vin is larger than the output voltage Vout. That is, in this assumption, when the output voltage Vout is smaller than the input voltage Vin, the NMOS 12 turns on while the second PMOS 13 turns off. As a result, the output voltage Vout is increased. To the contrary, when the output voltage Vout is lager than the input voltage Vin, the NMOS 12 turns off while the second PMOS 13 turns on. Consequently, the output voltage Vout is reduced. Thus, the analog buffer circuit 10 matches the output voltage Vout with the input voltage Vin.

Additionally, low input voltage Vin makes drain current of the first PMOS 11 easy to flow while high input voltage Vin makes the drain current difficult to flow. In other words, the low input voltage Vin increases the drain voltage of the NMOS 12 while the high input voltage Vin reduces the drain voltage. Thus, the analog buffer circuit 10 maintains a linear input-output voltage characteristic. When the input voltage Vin is significantly close to the high source voltage VDD, voltage drop at the first PMOS 11 is large and necessary potential is not supplied to the drain of the NMOS 12. In such a case, because the output voltage Vout is smaller than the input voltage Vin, the analog buffer circuit 10 can not maintain the linear input-output voltage characteristic.

Figure 2:
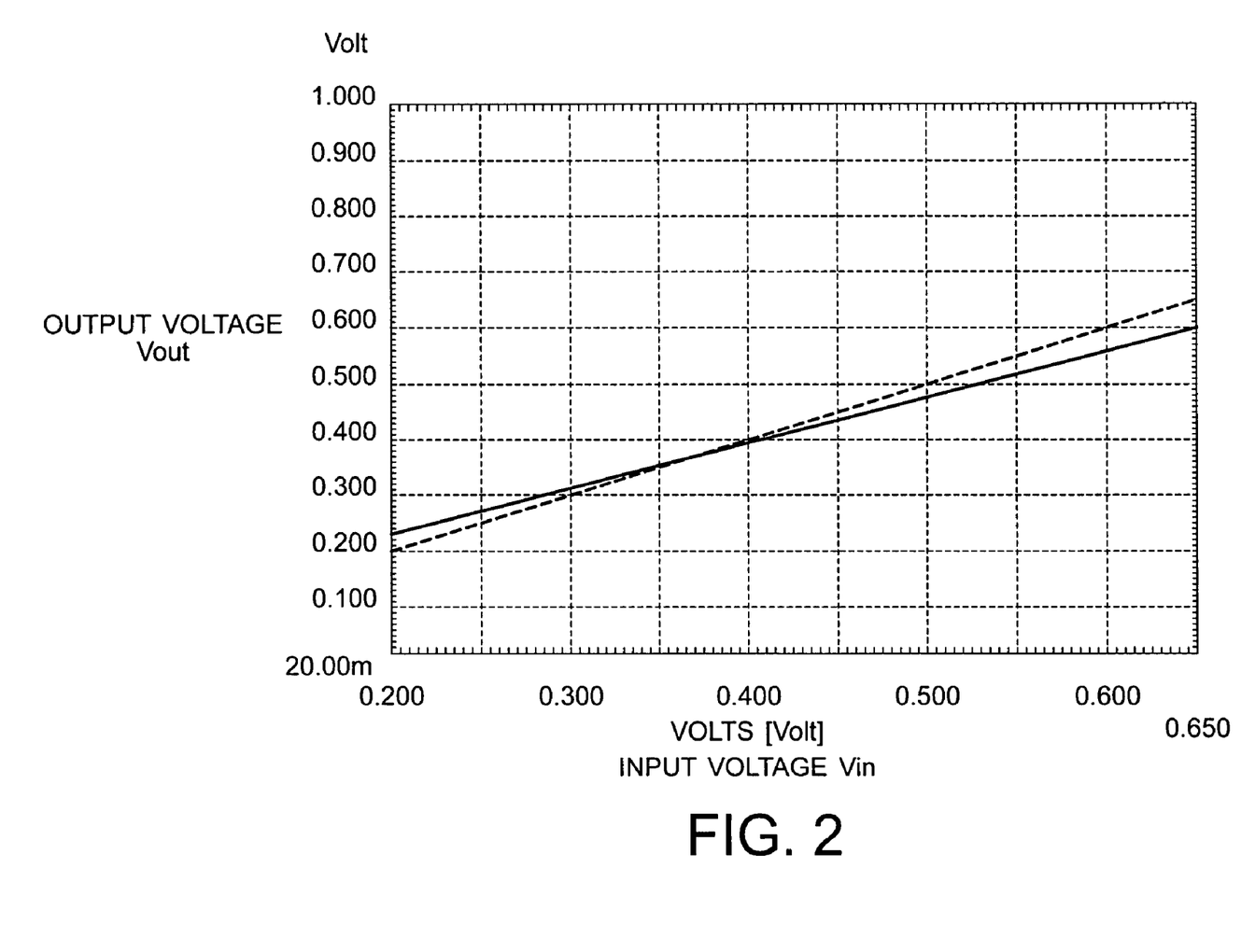
FIG. 2 is a graph showing an input-output voltage characteristic of the analog buffer circuit of FIG. 1, determined by simulation.

FIG. 2 shows a simulation result (represented by a solid line) of the input-output voltage characteristic of the analog buffer circuit 10 shown in FIG. 1. Herein, the high source voltage VDD is equal to 1.0 [V].

As understood from FIG. 2, the output voltage Vout is proportional to the input voltage Vin which is in a range from 0.2 to 0.65 [V]. A difference between the input voltage Vin and the output voltage Vout is smaller than about 10% of the input voltage Vin. Accordingly, it can be considered that the output voltage Vout is substantially equal to the input voltage Vin. Thus, the analog buffer circuit 10 produces the output voltage Vout substantially equal to the input voltage Vin.

As mentioned above, the analog buffer circuit 10 has simple configuration, high input impedance and the linear input output voltage characteristic.

Figure 3:
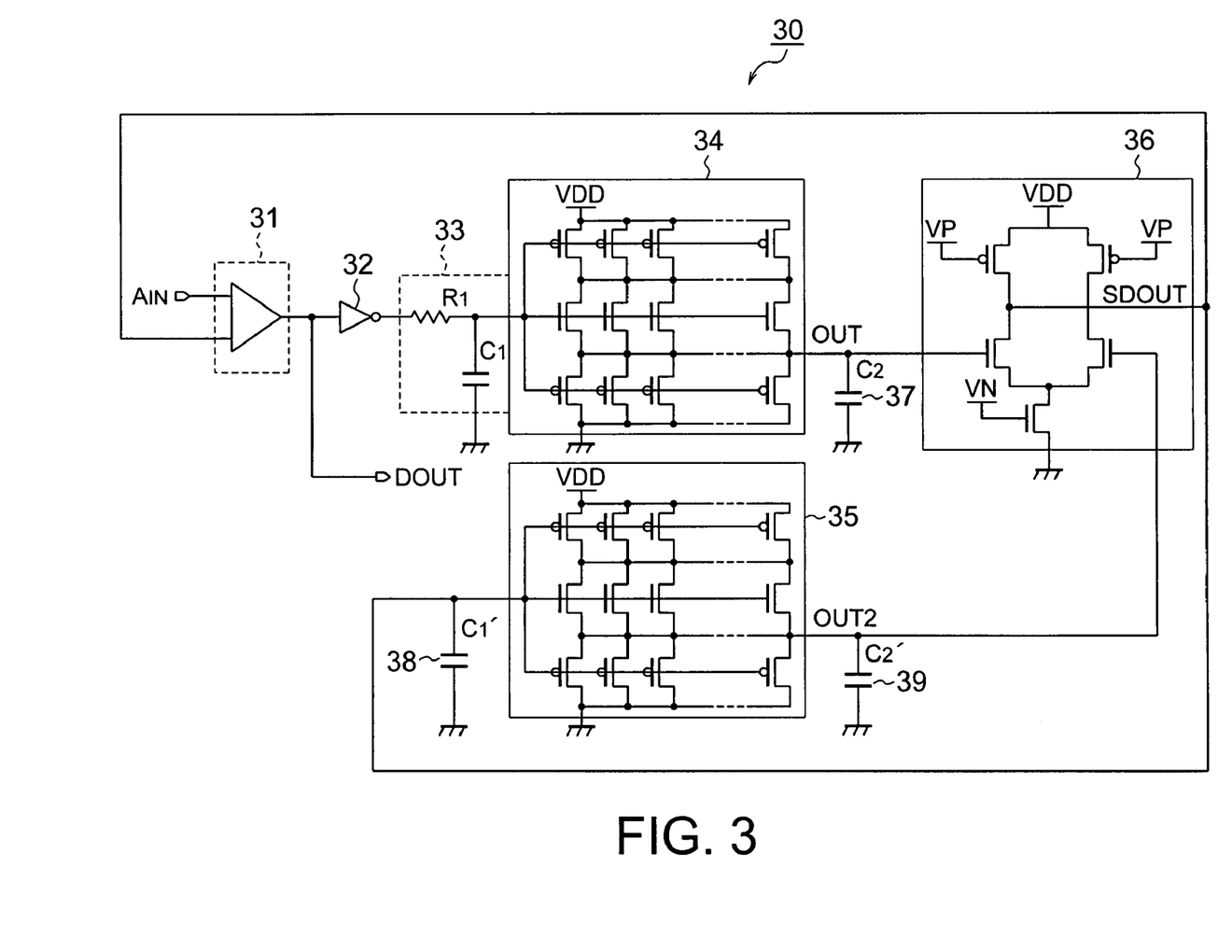
FIG. 3 is a circuit diagram showing a configuration of a duty adjusting circuit using the analog buffer circuit of FIG. 1.

The analog buffer circuit 10 is applicable to a duty ratio adjusting circuit 30 illustrated in FIG. 3, for example.

As shown in FIG. 3, the duty ratio adjusting circuit 30 has a differential buffer 31, an inverter 32, a low pass filter (LPF) 33, first and second analog buffers 34 and 35, a differential amplifying circuit 36 and capacitors 37, 38 and 39.

The differential buffer 31 receives an input sine wave signal Ain and an output voltage (i.e. a reference voltage) SDout of the differential amplifying circuit 36 and produces an output pulse signal Dout according to the input sine wave signal Ain and the reference voltage SDout. The output pulse signal Dout is divided into two, one of them is supplied to a later stage (not shown) and the other is supplied to the inverter 32.

The inverter 32 is connected to the differential buffer 31 to receive the output pulse signal Dout. The inverter 32 executes logical inversion of the output pulse signal Dout supplied from the differential buffer 31.

The LPF 33 is connected to the inverter 32 to remove high frequency component from the output of the inverter 32. For instance, the LPF 33 consists of a resister R1 and a capacitor C1.

The first analog buffer 34 is connected to the LPF 33 and includes a plurality of the analog buffer circuits 10 connected to one another in parallel to cope with a large output current (or transition current). The first analog buffer 34 produces output voltage equal to the output voltage of the LPF 33.

The second analog buffer 35 is similar to the first analog buffer 34 in configuration. The second analog buffer 35 is connected to the differential amplifier 36 to produce output voltage equal to the reference voltage SDout supplied from the differential amplifying circuit 36.

The capacitor 37 is connected to the first analog buffer 34 and the differential amplifying circuit 36. The capacitors 18 and 19 are connected to the second analog buffer 35 and the differential amplifying circuit 36. The capacitors 37, 38 and 39 integrate voltage on corresponding lines to suppress rapid change of the voltage on the lines. Thus, the capacitors 37 to 39 remove noises on the lines. Therefore, the duty ratio adjusting circuit 30 can execute stable operation at high accuracy.

The differential amplifying circuit 36 is connected to the first and second analog buffer 34 and 35 and the differential buffer 31 to generate the reference voltage SDout according to the difference between the output voltages of the first and the second analog buffers 34 and 35. For instance, the differential amplifying circuit 36 consists of p channel and n channel MOS transistors. The reference voltage SDout is supplied to the differential buffer 31 and the second analog buffer 35 as mentioned above.

In the duty ratio adjusting circuit 30 having abovementioned configuration, if the output pulse signal Dout has a smaller duty ratio smaller than a predetermined value, input voltage of the first analog buffer 34 is increased and thereby output voltage of the first analog buffer 34 is increased. Consequently, the output voltage SDout of the differential amplifying circuit 36 is reduced. The reduction of the output voltage SDout increases the duty ratio of the output pulse signal Dout output from the differential buffer 31.

To the contrary, if the output pulse signal Dout has a larger duty ratio larger than the predetermined value, the input voltage of the first analog buffer 34 is reduced and thereby output voltage of the first analog buffer 34 is reduced. Consequently, the output voltage SDout is increased. The increase of the output voltage SDout reduces the duty ratio of the output pulse signal Dout.

Thus, the duty ratio adjusting circuit 30 automatically adjusts the output pulse signal Dout to have the predetermined value of the duty ratio.

FIGS. 4 to 7 show a simulation result of voltage changes at predetermined points in the duty ratio adjusting circuit 30.

Figure 4:
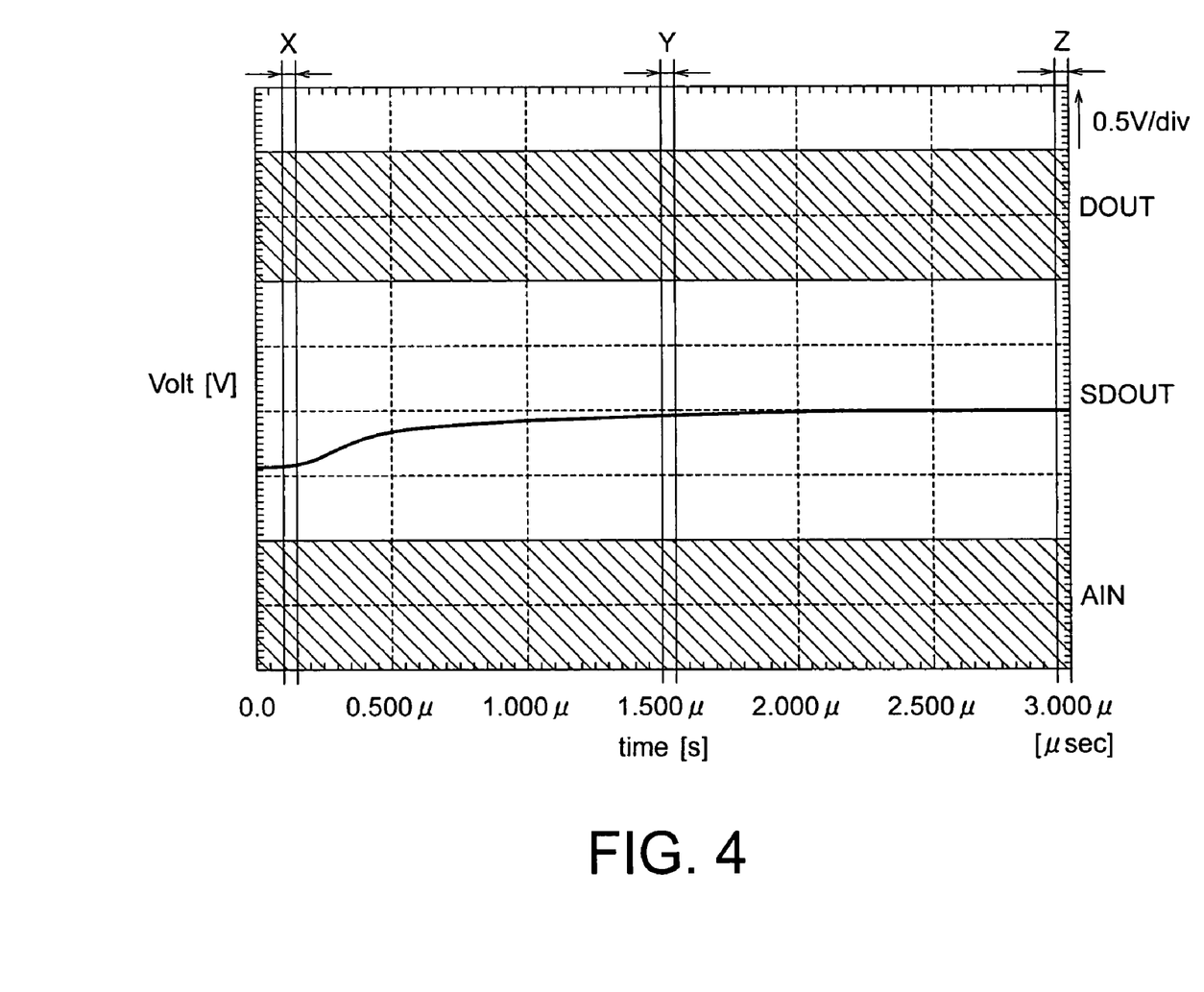
FIG. 4 is a graph showing voltage variations of an input signal Ain, an output voltage SDout and an output pulse signal Dout.

In particular, FIG. 4 is a graph showing changes of the input signal Ain, the output pulse signal Dout and the output voltage SDout during 3 [μsec] from a point of starting operation. However, the input signal Ain and the output pulse signal Dout are represented by hatching which corresponds to their amplitudes. This is because the input signal Ain and the output pulse signal Dout have very short cycles (or high frequencies about 250 MHz).

As understood from FIG. 4, the output voltage SDout converges to a predetermined value with the course of time.

Figure 5:
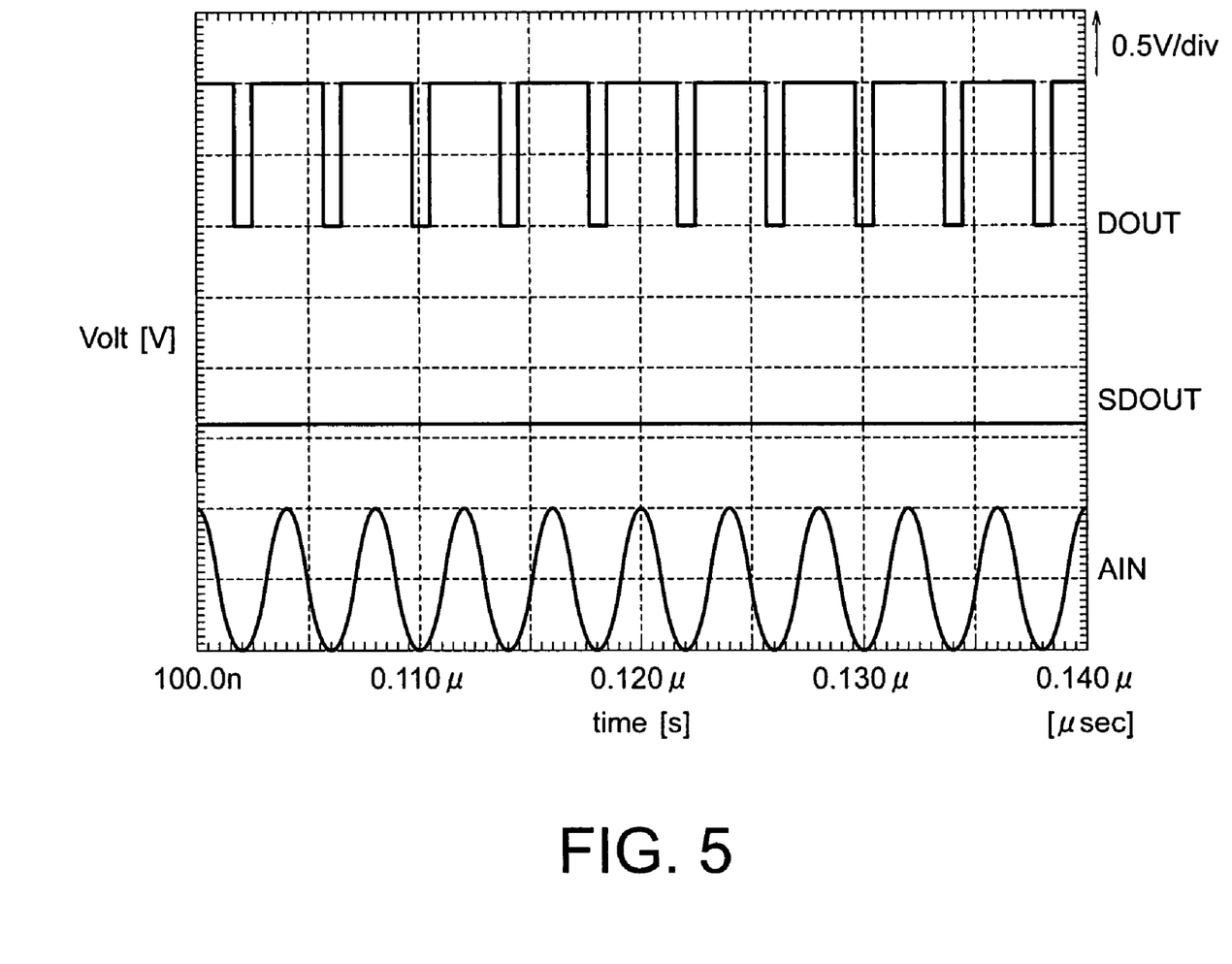
FIG. 5 is an expanded graph of a time period X of FIG. 4, expanded along the time axis.
Figure 6:
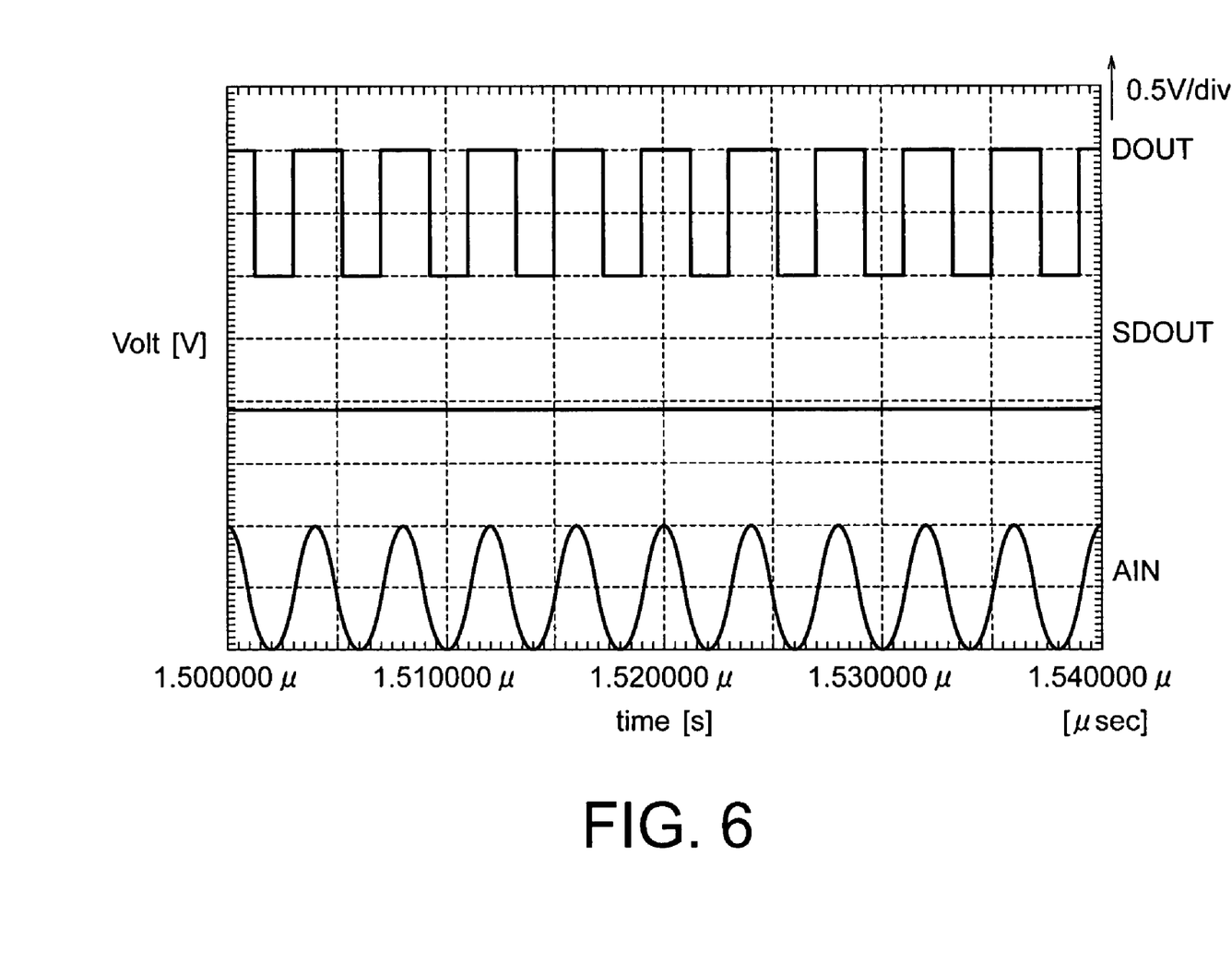
FIG. 6 is an expanded graph of a time period Y of FIG. 4, expanded along the time axis.
Figure 7:
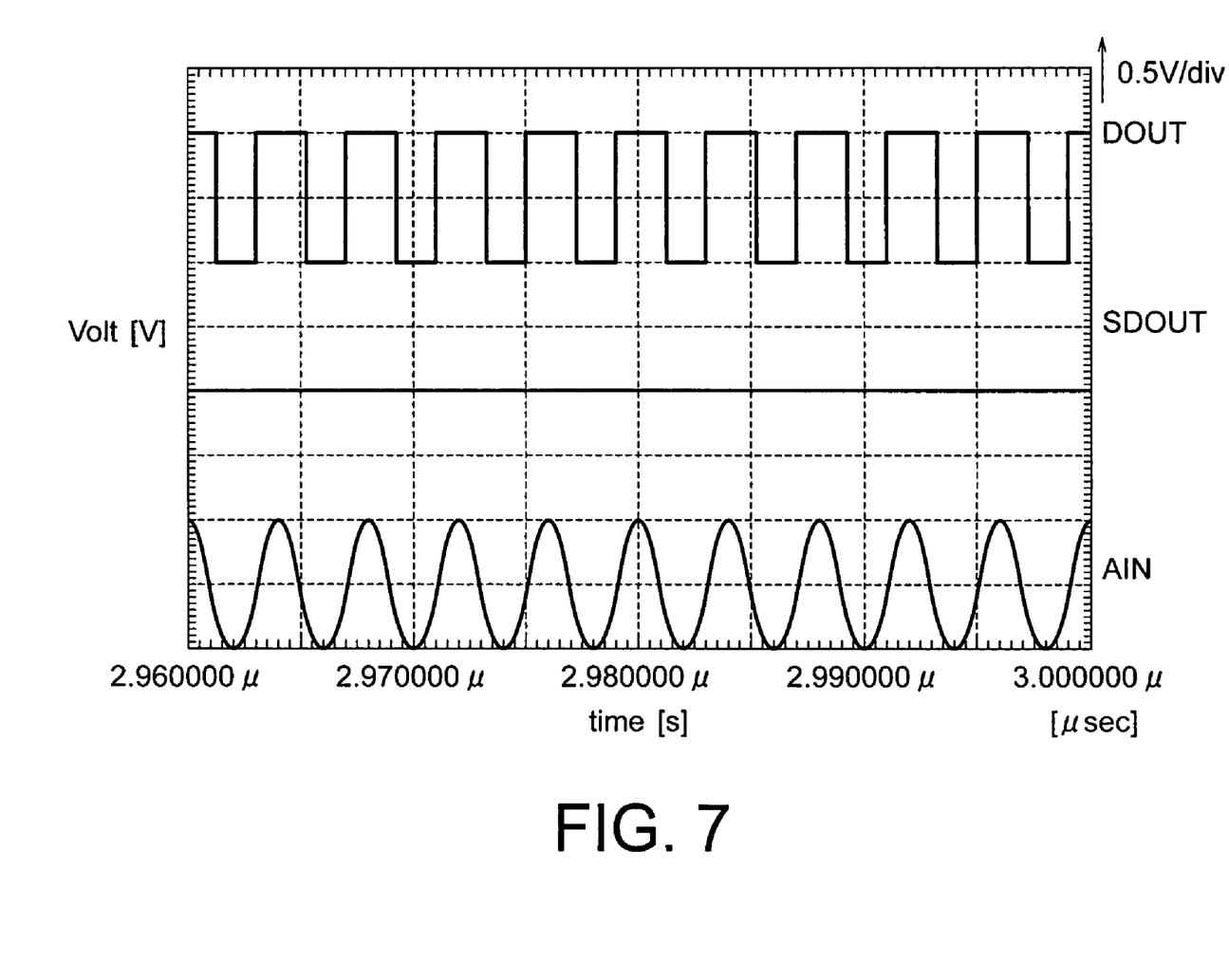
FIG. 7 is an expanded graph of a time period Z of FIG. 4, expanded along the time axis.

FIGS. 5 to 7 correspond to periods X, Y and Z of FIG. 4, respectively. As understood from comparison of FIGS. 5 to 7, the input signal Ain has an unchanged wave form. On the other hand, the output voltage SDout is increased by lapse of time. The duty ratio of the output pulse signal Dout is reduced as the output voltage SDout is increased. In other words, the duty ratio of the output pulse signal Dout converges to a prescribed value according to the convergence of the output voltage SDout.

While this invention has thus far been described in conjunction with the preferred embodiment thereof, it will readily be possible for those skilled in the art to put this invention into practice in various other manners. For example, the analog buffer circuit 10 may be configured by transistors different from MOSFETs. The analog buffer circuit 10 may be designed to achieve a linear input-output characteristic regarding a different range of the input voltage.

What is claimed is:

1. An analog buffer having an approximately linear input output voltage characteristic, said analog buffer comprising:
   three field effect transistors disposed between an input terminal and an output terminal for accomplishing the approximately linear input output voltage characteristic;
   wherein said field effect transistors are connected in serial between power supplying terminals and have gates connected to said input terminal in common, and
   wherein a change in input voltage supplied to said input terminal produces a substantially equal change in output voltage appearing on said output terminal for all input voltages within a range of 0.2 to 0.65 volts.

2. An analog buffer as claimed in claim 1,
   wherein said field effect transistors comprising metal oxide semiconductor field effect transistors.

3. An analog buffer having an approximately linear input output voltage characteristic, said analog buffer comprising:
   three field effect transistors disposed between an input terminal and an output terminal for accomplishing the approximately linear input output voltage characteristic;
   wherein said field effect transistors are connected in serial between power supplying terminals and have gates connected to said input terminal in common
   wherein the power supplying terminals comprise a high potential terminal and a low potential terminal;
   wherein said field effect transistors comprise two p channel field effect transistors and an n channel field effect transistor connected between said p channel field effect transistors such that a first p channel field effect transistor is connected between the high potential terminal and the n channel field effect transistor, and a second p channel field effect transistor is connected between the low potential terminal and the n channel field effect transistor; and
   wherein said output terminal is connected to a connecting point between said n channel field effect transistor and said second p channel field effect transistor.

4. An analog buffer as claimed in claim 3,
   wherein output voltage which appears on said output terminal is substantially equal to input voltage supplied to said input terminal.

5. An analog buffer as claimed in claim 4,
   wherein said input voltage is within a range of 0.2 to 0.65 volts.

6. An analog buffer having an approximately linear input output voltage characteristic, said analog buffer comprising:
   three field effect transistors disposed between an input terminal and an output terminal for accomplishing the approximately linear input output voltage characteristic;
   wherein said field effect transistors are connected in serial between power supplying terminals and have gates connected to said input terminal in common,
   wherein output voltage which appears on said output terminal is substantially equal to input voltage supplied to said input terminal, and
   wherein said input voltage is within a range of 0.2 to 0.65 volts.

7. An analog buffer having an approximately linear input output voltage characteristic, said analog buffer comprising:
   three field effect transistors disposed between an input terminal and an output terminal for accomplishing the approximately linear input output voltage characteristic;
   wherein said field effect transistors are connected in serial between power supplying terminals and have gates connected to said input terminal in common,
   wherein the power supplying terminals comprise a high potential terminal and a low potential terminal,
   wherein said field effect transistors comprise two p channel field effect transistors and an n channel field effect transistor connected between said p channel field effect transistors such that a first p channel field effect transistor is connected between the high potential terminal and the n channel field effect transistor, and a second p channel field effect transistor is connected between the low potential terminal and the n channel field effect transistor,
   wherein said output terminal is connected to a connecting point between said n channel field effect transistor and said second p channel field effect transistor, and
   wherein the second p channel field effect transistor is connected directly to the low potential terminal.

* * * * *